United States Patent [19]
Kim et al.

[11] Patent Number: 5,673,001
[45] Date of Patent: Sep. 30, 1997

[54] METHOD AND APPARATUS FOR AMPLIFYING A SIGNAL

[75] Inventors: Jin Dong Kim, Mundelein; James John Crnkovic, Lake Zurich; Armin Werner Klomsdorf, Spring Grove; David Sutherland Peckham, Barrington Hills, all of Ill.

[73] Assignee: Motorola, Inc., Schaumburg, Ill.

[21] Appl. No.: 482,158

[22] Filed: Jun. 7, 1995

[51] Int. Cl.⁶ .................................................... H03G 3/30
[52] U.S. Cl. ........................ 330/284; 330/145; 455/126
[58] Field of Search ............................ 330/129, 145, 330/279, 284; 455/116, 126, 127

[56] References Cited

U.S. PATENT DOCUMENTS

| | | |
|---|---|---|
| 3,560,995 | 2/1971 | Zielinski et al. . |
| 4,225,827 | 9/1980 | Davis, Jr. . |
| 4,367,443 | 1/1983 | Hull et al. . |
| 4,390,851 | 6/1983 | Higgins et al. . |
| 4,592,073 | 5/1986 | Watanabe . |
| 4,602,218 | 7/1986 | Vilmur et al. . |
| 4,628,275 | 12/1986 | Skipper et al. . |
| 4,689,576 | 8/1987 | Wisseman . |
| 4,843,345 | 6/1989 | Soderstrom . |
| 4,945,314 | 7/1990 | Van Den Bungelaar . |
| 4,985,686 | 1/1991 | Davidson et al. . |
| 4,992,753 | 2/1991 | Jenson et al. . |
| 5,029,298 | 7/1991 | Chiba et al. . |
| 5,038,112 | 8/1991 | O'Neill . |
| 5,043,672 | 8/1991 | Youn . |
| 5,060,294 | 10/1991 | Schwent et al. . |
| 5,126,688 | 6/1992 | Nakanishi et al. . |
| 5,138,275 | 8/1992 | Abbiati et al. ................ 330/149 |
| 5,150,075 | 9/1992 | Hietala et al. . |
| 5,173,835 | 12/1992 | Cornett et al. . |
| 5,204,637 | 4/1993 | Trinh ........................ 330/129 |
| 5,275,879 | 1/1994 | Elingson et al. . |
| 5,276,912 | 1/1994 | Siwiak et al. ................ 330/86 X |
| 5,278,994 | 1/1994 | Black et al. . |
| 5,278,996 | 1/1994 | Shitara . |
| 5,278,997 | 1/1994 | Martin . |
| 5,317,277 | 5/1994 | Cavigelli . |
| 5,319,804 | 6/1994 | Matsumoto et al. . |
| 5,329,259 | 7/1994 | Stengel et al. . |
| 5,339,041 | 8/1994 | Nitardy ........................ 330/10 |
| 5,361,403 | 11/1994 | Dent ........................ 330/129 X |

FOREIGN PATENT DOCUMENTS

| | | |
|---|---|---|
| 685936A1 | 12/1995 | European Pat. Off. . |
| 62-139425 | 6/1987 | Japan . |

OTHER PUBLICATIONS

Willis–Amplifier Having Adjustable Gain and Constant Input Impedance TN No.1258 Sep. 11, 1980.
Motorola Technical Developments vol. 21 Feb. 1994, pp. 17 & 18.
US Application Serial No. 08/332,968 entitled Method and Apparatus for Increasing Amplifier Efficiency, Filed on Nov. 1, 1994 by William P. Albreth Jr., et al.
U.S. Ser. No. 08/332,968 Alberth, Jr. et al., filed Nov. 1, 1994.

*Primary Examiner*—James B. Mullins
*Attorney, Agent, or Firm*—John J. King

[57] ABSTRACT

A unique method and apparatus modifies the load impedance at the output of a power amplifier by varying a voltage variable capacitor (VVC) (310) to maximize the efficiency of the power amplifier (304). A comparator (509) generates amplifier control signal (211) based upon a detected power output signal (216) and a reference signal. In addition to providing power control, the control signal is also coupled to a VVC circuit (506) to control the output impedance of the power amplifier. In an alternate embodiment, a separate VVC control signal (527) based upon a comparison of the power control signal and the battery voltage is coupled to a VVC. In another alternate embodiment, a second VVC can be coupled in parallel to the first VVC. The second VVC is preferably controlled by a signal (805) based upon the current in the power amplifier. Finally, an alternate embodiment incorporates a VVC circuit (506) at the input of the power amplifier to compensate for variations in input impedance to improve other power amplifier parameters such as IM, gain, output power and noise level.

28 Claims, 10 Drawing Sheets

METHOD AND APPARATUS FOR AMPLIFYING A SIGNAL

FIELD OF THE INVENTION

This application is related to amplifiers, and more particularly to a method and apparatus for amplifying a signal.

BACKGROUND OF THE INVENTION

A power amplifier (PA) is used in a wireless communication device such as a cellular radiotelephone to amplify radio frequency (RF) signals so that the device can communicate with a fixed site transceiver. Considerable power in a wireless communication device is dissipated in the power amplifier. For example, in a portable cellular radiotelephone, a significant percent of the power dissipation is in the power amplifier. Efficiencies of a power amplifier significantly depend upon the source and load variations the power amplifier experiences over the operating frequency of a cellular radio telephone. One problem associated with designing a high-efficiency power amplifier is adequately compensating for these source and load variations.

Wireless communication devices typically transmit radio frequency signals at a plurality of power levels. For example, cellular radiotelephones require seven 4 dB steps in output power of the radio transmitter. However, the efficiency of the power amplifier significantly varies over the output power range. Because current drain efficiency of the power amplifier is most affected at a higher output power, the power amplifier is designed to maximize efficiency at higher output power levels. One technique to improve power efficiency requires switching the quiescent current of the power amplifier in response to a power amplifier output step change. At the lowest power step, the power amplifier is normally in class A mode of operation. By changing the bias conditions of the power amplifier at the lower steps, the power amplifier could be kept in class AB mode with a corresponding improvement in efficiency.

Operational efficiency is also particularly dependent on the load impedance variation caused by impedance changes of the duplex filter over a wide bandwidth or environmental factors such as the placement of a user's hand or body near the antenna. The power amplifier is generally designed with the saturated output power higher than the typical operating output power to accommodate power fluctuations caused by load impedance variations. To compensate for the reduced efficiency of the power amplifier designed at such a higher output power, the load at the output of the power amplifier can be varied by switching a diode in or out at the output. For example, a dual mode power amplifier operates in either the linear mode or the saturation mode based upon load switching. This load switching accommodates operation of the device on two different cellular radiotelephone systems. However, such discrete switching of the load at the output provides some improvement in efficiency, but does not maximize efficiency.

Improving the power amplifier efficiency is essential to increasing the operating time for a given battery of the wireless communication device. Accordingly, there is a need for a method and apparatus for amplifying a radio frequency signal with greater efficiency over source and load variations. There is also a need for operating a power amplifier efficiently over a wide range of operating voltages.

DESCRIPTION OF THE PREFERRED EMBODIMENT

The efficiency of a power amplifier is directly related to the load impedance variation caused by the duplex filter's input impedance change. This input impedance change can be caused by the transmission frequency variation over a wide bandwidth or other loading variations such as the proximity of a user's hand or body to the antenna. To compensate for the load impedance variation, the load impedance can be adjusted continuously or permanently by using a voltage variable capacitor according to the present invention. In particular, a voltage variable capacitor can be placed at the output of the power amplifier to vary the output load impedance to improve the efficiency of the power amplifier. Alternatively, a voltage variable capacitor could be placed before the power amplifier to compensate for input impedance variation and to improve other power amplifier parameters such as IM, gain, output power and noise level. A voltage variable capacitor could be placed at either the input or the output of the power amplifier to efficiently operate the power amplifier over a wide range of operating voltages.

Figure 1:
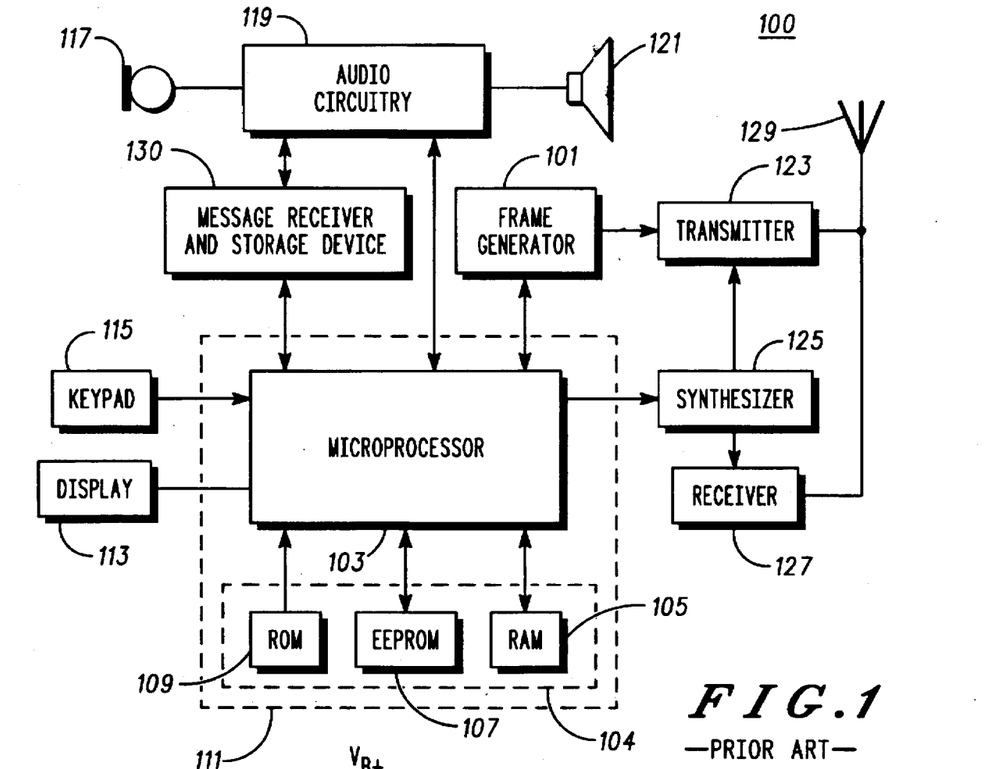
FIG. 1 is a block diagram of a conventional wireless communication device, such as a cellular radio telephone.

Turning first to FIG. 1, a block diagram of a wireless communication device such as a cellular radiotelephone incorporating the present invention is shown. In the preferred embodiment, a frame generator ASIC 101, such as a CMOS ASIC available from Motorola, Inc. and a microprocessor 103, such as a 68HC11 microprocessor also available from Motorola, Inc., combine to generate the necessary communication protocol for operating in a cellular system. Microprocessor 103 uses memory 104 comprising RAM 105, EEPROM 107, and ROM 109, preferably consolidated in one package 111, to execute the steps necessary to generate the protocol and to perform other functions for the communication unit, such as writing to a display 113, accepting information from a keypad 115, controlling a frequency synthesizer 125, or performing steps necessary to amplify a signal according to the method of the present invention. ASIC 101 processes audio transformed by audio circuitry 119 from a microphone 117 and to a speaker 121.

A transceiver processes the radio frequency signals. In particular, a transmitter 123 transmits through an antenna 129 using carrier frequencies produced by a frequency synthesizer 125. Information received by the communication device's antenna 129 enters receiver 127 which demodulates the symbols comprising the message frame using the carrier frequencies from frequency synthesizer 125. The communication device may optionally include a message receiver and storage device 130 including digital signal processing means. The message receiver and storage device could be, for example, a digital answering machine or a paging receiver.

Figure 2:
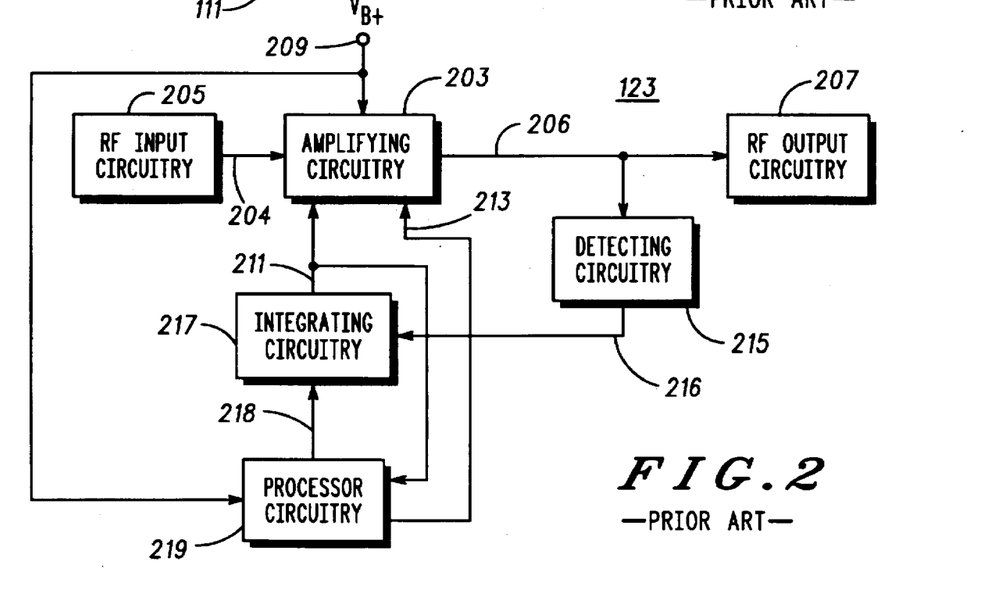
FIG. 2 is a block diagram of a conventional transmitter circuit of the block diagram of FIG. 1.

Turning now to FIG. 2, a block diagram illustrates the transmitter. 123 having amplifying circuitry 203 and corresponding control circuitry comprising detecting circuitry 215, integrating circuitry 217, and processor circuitry 219. Amplifying circuitry 203 contains at least one amplifying element, preferably a gallium arsenide FET (Field Effect Transistor) to receive an input signal and generate an output signal which is an amplified version of the input signal. A power source 209, such as a battery, generates a battery voltage signal denoted by $V_{B+}$ and supplies power to the amplifying circuitry 203. Although the battery comprising the power source 209 may be fabricated to provide a particular battery voltage signal, such as 3.0 volts, 4.8 volts or 6.0 volts, when nominally charged, the amplifying circuitry 203 must be capable of functioning when the battery has significantly discharged to a voltage lower than the particular voltage.

Amplifying circuitry 203 amplifies an RF input signal 204 (typically containing voice and data to be transmitted) provided by RF input circuitry 205 into an amplified RF output signal 206. The RF input signal 204 is amplified such that the amount of power in the RF output signal 206 corresponds to one of a plurality of predetermined power output levels which define the operation of the transmitter 123. The amplifying circuitry 203 subsequently outputs the RF output signal 206 to RF output circuitry 207.

The block diagram of FIG. 2 contains an output power control loop to maximize the efficiency of the amplifying circuitry 203. The power control loop is generally controlled by processor circuitry 219. Although transmitter 123 utilizes the integral .processor circuitry 219, the processor-dependent functionality of the transmitter 123 could be solely provided by a central processor for the device, such as microprocessor 103 shown in FIG. 1.

The output power control loop maintains the amount of power in the RF output signal 206 at a constant level by varying the magnitude of amplification of the amplifying circuitry 203 via an amplifier control signal 211. The output power control loop consists of detecting circuitry 215, processor circuitry 219, and integrating circuitry 217 and functions while transmitter 123 is in operation.

Detecting circuitry 215 is coupled between the amplifying circuitry 203 and RF output circuitry 207 as well as to the integrating circuitry 217 to detect the power level of the RF output signal 206. Upon detection, the detecting circuitry 215 generates and outputs a detected power output signal 216 to the integrating circuitry 217. The detected power output signal 216 corresponds to the amount of power in the RF output signal 206.

Processor circuitry 219 is coupled to the integrating circuitry 217 to provide a power output control signal 218. The power output control signal 218 contains a predetermined value defining the amount of power that should be in the RF output signal 206. The predetermined value is one of a plurality of phasing values stored in a memory of the processor circuitry 219 during manufacture.

Integrating circuitry 217 compares the detected power output signal 216 and power output control signal 218 to ensure that the amount of power in RF output signal 206 is correct. Integrating circuitry 217 accordingly adjusts the magnitude of amplifier control signal 211 to ensure that amplifying circuitry 203 provides an accurate and constant RF output signal 206.

Figure 3:
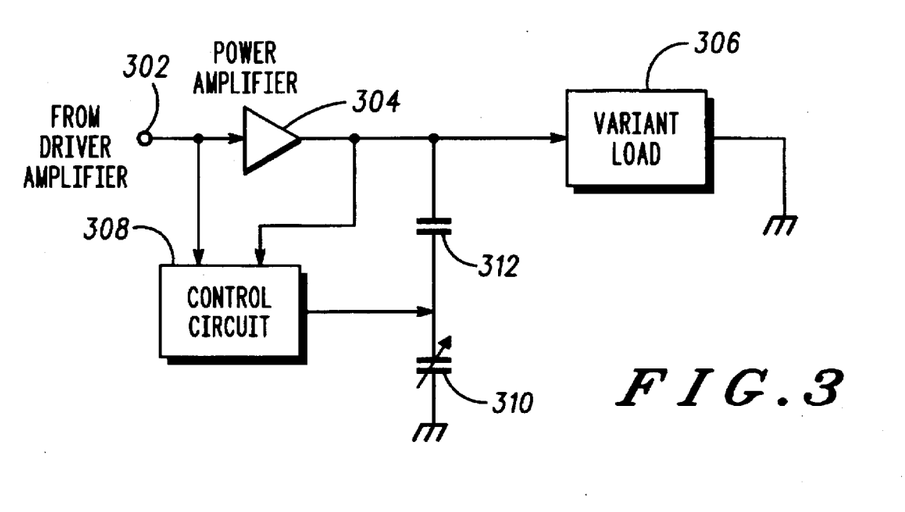
FIG. 3 is a block diagram of a transmitter circuit having a voltage variable capacitor according to the present invention.

Turning now to FIG. 3, a block diagram of a transmitter circuit incorporating a voltage variable capacitor according to the present invention is shown. An output 302 of a driver amplifier is input to a power amplifier 304 which drives a variant load 306. The impedance of the variant load can change based upon frequency variation over the transmission bandwidth or other environmental factors, such as the proximity of the user's hand or body to the antenna of the wireless communication device. The input to and the output of the power amplifier are coupled to a control circuit 308. Control circuit 308, which could for example be a microprocessor, determines whether the power amplifier is operating at maximum efficiency by evaluating the input and output signals. Control circuit 308 also controls a voltage variable capacitor 310 which is coupled to the output of the power amplifier by a capacitor 312. In particular, control circuit 308 adjusts the capacitance of voltage variable capacitor 310 to vary the load at the output of the power amplifier and maximize the efficiency of the power amplifier.

Figure 4:
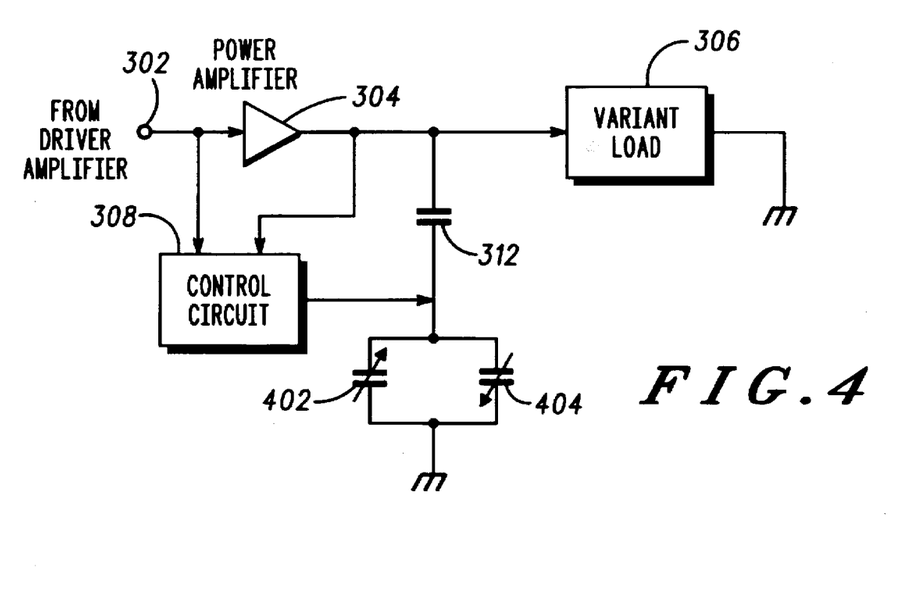
FIG. 4 is a block diagram of an alternate embodiment of a transmitter circuit having voltage variable capacitors coupled in parallel according to the present invention.

The preferred voltage variable capacitor is disclosed in U.S. Pat. No. 5,137,835, filed Oct. 15, 1991 (application Ser. No. 776,111) by Kenneth D. Cornett, E. S. Ramakrishnan, Gary H. Shapiro, Raymond M. Caldwell and Wei-Yean Howrig, the entire patent of which is incorporated herein by reference. However, any capacitor using a ferroelectric material which provides variable capacitance can be used. As shown in the embodiment of FIG. 4 according to the present invention, the voltage variable capacitor 310 can be replaced by a pair of voltage variable capacitors 402 and 404 which are of opposite polarity to eliminate any non-linearity during operation.

Figure 5:
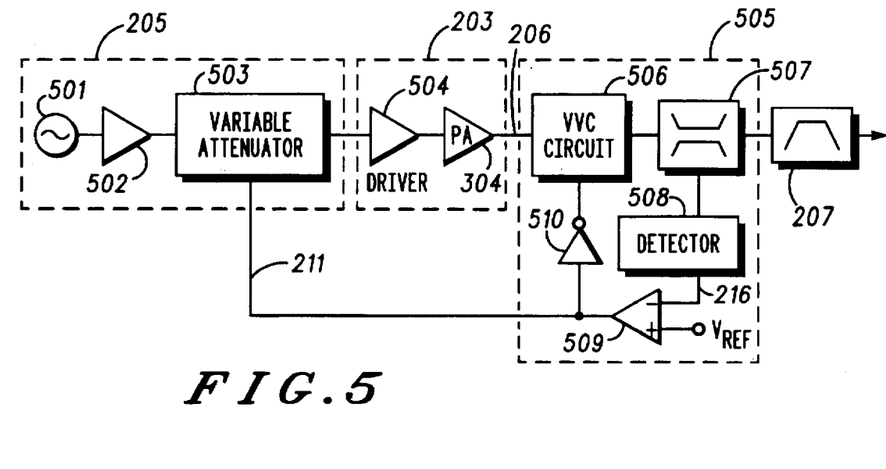
FIG. 5 is a block diagram of an alternate embodiment of a transmitter circuit according to the present invention.

Turning now to FIG. 5, a block diagram of an alternate embodiment of a transmitter circuit according to the present invention is shown. In particular, a voltage controlled oscillator (VCO) 501 combines an information signal with an oscillating signal of a certain frequency to create the frequency modulated information signal. The frequency modulated information signal is then coupled to a buffer 502 that functions both as a filter, typically a passband filter, and an amplification device that increases the magnitude of the frequency modulated information signal. After amplification by buffer 502, RF input signal 204 is coupled through a variable attenuator 503 which can be adjusted by amplifier control signal 211 to provide high attenuation when the transmitter 123 is not transmitting or low attenuation to permit transmission of RF input signal 204.

RF input signal 204 is coupled to a power amplifier driver 504 that forms an initial stage of the amplifying circuitry 203. In the preferred embodiment, power amplifier driver 504 is capable of amplifying RF input signal 204 from a power level of about +8 dBm to a power level as high as about +17 dBm. Power amplifier driver 504 is coupled to an input of the power amplifier 304 which forms the final stage of amplifying circuitry 203. Upon receiving the RF input signal 204 from power amplifier driver 504, power amplifier 304 further amplifies the RF input signal 204 to generate RF output signal 206 at a power level as high as +30 dBm. In the preferred embodiment, the power amplifier 304 is a gallium arsenide FET that requires a negative biasing voltage between about 0 V and −5.4 V for operation.

Coupled between amplifying circuitry 203 and RF output circuitry 207 at the output of power amplifier 304 is power control circuit 505 which preferably includes a VVC circuitry 506. Power control circuit 505 maintains the amount of power in the RF output signal 206 at a constant level by varying amplifier control signal 211. In the embodiment of FIG. 5, amplifier control signal 211 varies the amount of power in RF output signal 206 by varying the input signal to amplifying circuitry 203. However, amplifier control signal 211 could instead be coupled to either the driver stage or the power amplifier stage of amplifying circuit 203. VVC circuitry 506 preferably includes a voltage variable capacitor and output matching circuitry as will be described in greater detail in reference to FIG. 6.

Power control circuit 505 preferably comprises a directional coupler 507 such as an electromagnetic coupler which couples the RF output signal 206 to a detector 508 without causing excessive loss to the RF output signal 206. Detector 508 generates a detected power output signal 216 which is then coupled to an inverting terminal of a comparator 509. A reference voltage $V_{REF}$ is coupled to the non-inverting terminal of comparator 509. Comparator 509 generates an amplifier control signal 211 which is coupled to variable attenuator 503 and VVC circuitry 506 by way of an inverter 510. Amplifier control signal 211 will increase or decrease the amount of attenuation by variable attenuator 503 to maintain a constant power at the output of the power amplifier. Amplifier control signal 211 will also simultaneously vary the load at the output of the power amplifier by varying a voltage variable capacitor in VVC circuitry 506. Amplifier control signal 211 will maximize the efficiency of power amplifier 304 while maintaining the constant power output.

Figure 6:
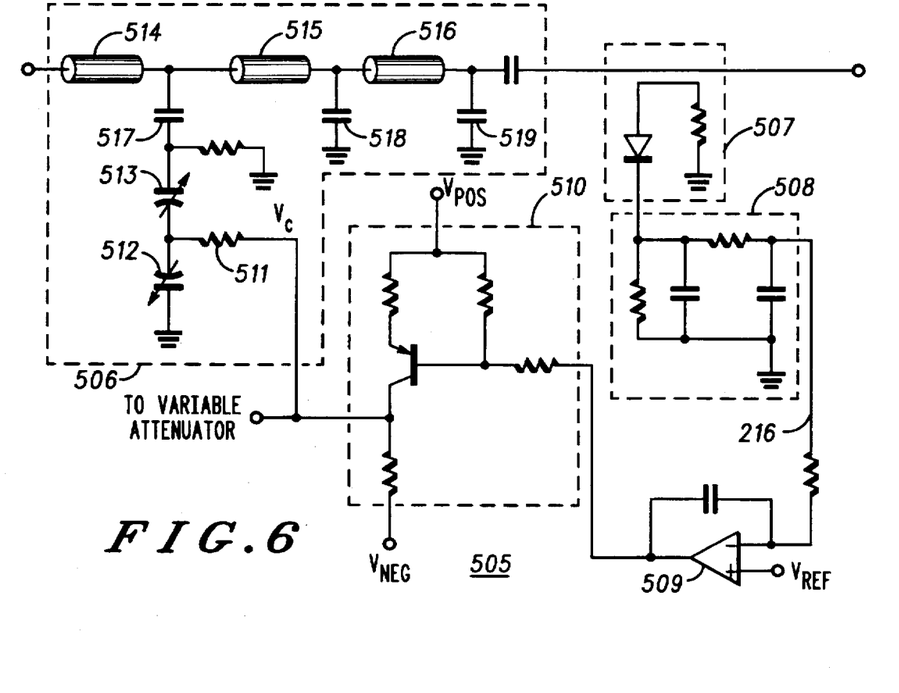
FIG. 6 is a schematic diagram of the voltage variable capacitor circuit 505 of FIG. 5.

Turning now to FIG. 6, a schematic diagram shows the preferred power control circuit 505 according to the embodiment of FIG. 5. In particular, directional coupler 507 preferably includes a resistor and a diode for directing the coupled RF output signal 206 to detector 508. Detector 508 preferably comprises a low pass filter to output the detected power output signal 216 having a voltage that corresponds to the amount of power in the RF output signal 206. Finally, VVC circuitry 506 comprises an input resistor 511 coupled between a pair of dielectrically opposed voltage variable capacitors 512 and 513 coupled in series. The voltage variable capacitors are coupled to a series of transmission lines 514, 515 and 516, each of which includes a DC blocking capacitor 517, 518 and 519 respectively coupled to ground. The transmission lines are selected to provide the proper impedance matching at the output of the power amplifier.

Figure 7:
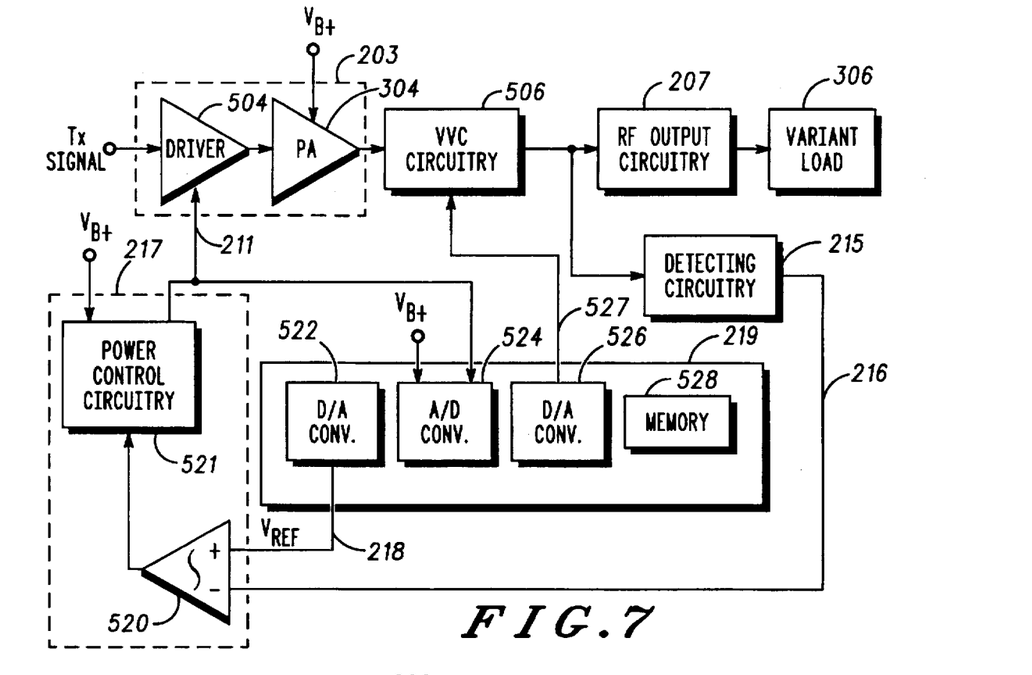
FIG. 7 is a block diagram of an alternate embodiment of a transmitter circuit for a wireless communication device according to the present invention.

Turning now to FIG. 7, a block diagram of in the alternate embodiment of a transmitter circuit incorporating voltage variable capacitor circuitry is shown. In particular, a transmit signal is received at a power amplifier driver 504 which is coupled to power amplifier 304. The output of power amplifier 304 is coupled to VVC circuitry 506. The VVC circuitry 506 is coupled to a variant load 306 by way of RF output circuitry 207. The output of VVC circuitry is also coupled to detecting circuitry 215 which provides a signal to integrating circuitry 217 comprising a integrator 520 and power control circuit 521. In particular, integrator 520 receives power output signal 216 of detecting circuitry 215 at its inverting input terminal and an input representing the power output control signal 218 from a digital-to-analog (D/A) converter 522 of processor circuitry 219 at its non-inverting terminal. Power output control signal 218 preferably corresponds to a predetermined power level at which the transmitter should be transmitting signals. Integrator 520 compares power output control signal 218 to detected power output signal 216. Power control circuit 521 generates amplifier control signal 211 based upon the comparison of power output control signal 218 to detected power output signal 216. Amplifier control signal 211 is increases or decreases the output of the driver stage to maintain a constant desired output of the power amplifier (i.e. an output when power output control signal 218 is equal to detected power output signal 216).

In addition to maintaining a constant power amplifier output, processor circuitry 219 controls VVC circuitry 506 to operate amplifying circuit 203 at the maximum efficiency. In particular, processor circuitry 219 includes an analog-to-digital (A/D) converter 524 which receives the battery supply voltage $V_{B+}$ and amplifier control signal 211 output from power control circuit 521. Although a single A/D converter 524 is shown, separate A/D converters could be used. Processor circuitry 219 monitors amplifier control signal 211 and battery supply voltage $V_{B+}$ to determine whether power amplifier 304 is operating as close to saturation as possible to operate the power amplifier as efficiently as possible. As will be described in detail in reference to FIG. 9, the load at the output of the power amplifier can be varied to operate the power amplifier closer to saturation. In particular, processor circuitry 219 also includes a D/A converter 526 which generates a voltage variable capacitor control signal 527 to VVC circuitry 506. This signal could be, for example, a voltage applied to an electrode of the voltage variable capacitor. This variation in the load compensates for any variation in the external variant load, while maintaining constant power at the output. Finally, processor circuitry 219 preferably includes a memory 528 for storing power control values, phasing values and other operating parameters.

Figure 8:
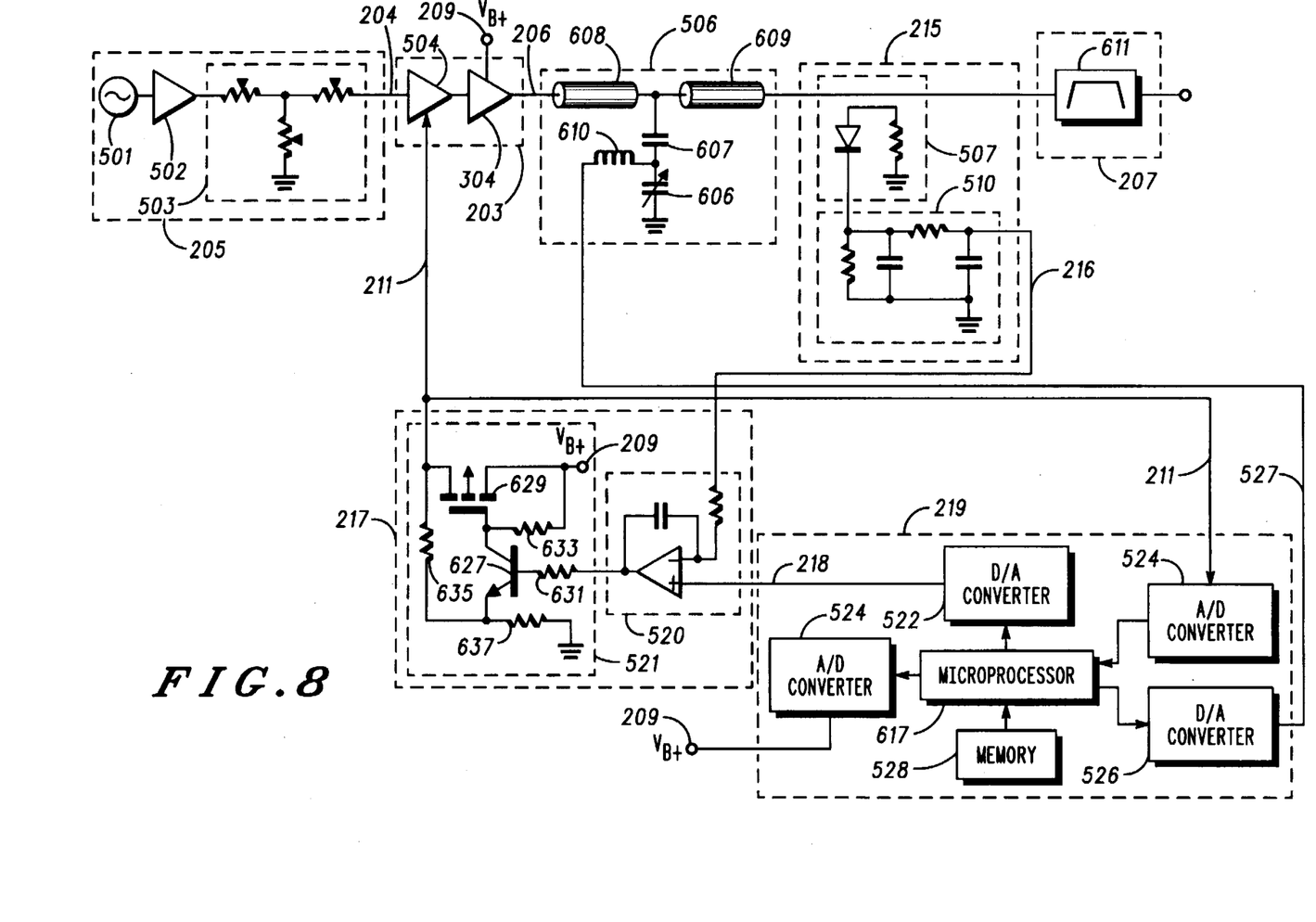
FIG. 8 is a schematic diagram of the transmitter circuit of FIG. 7.

Turning now to FIG. 8, a schematic diagram shows transmitter circuit of FIG. 7. In particular, VCO 501 and buffer 502 described in FIG. 7 are coupled to a variable attenuator 503 comprising variable resistors. Variable attenuator 503 can be adjusted to provide high attenuation when transmitter 123 is not transmitting or low attenuation to permit transmission of RF input signal 204. RF input signal 204 is coupled to a power amplifier driver 504 and power amplifier 304 of amplifying circuitry 203. At the output of power amplifier 304 is VVC circuitry 506. VVC circuitry 506 preferably includes transmission lines 608 and 609. Voltage variable capacitor 606 is coupled to a capacitor 607 at a node between transmission lines 608 and 609. Voltage variable capacitor 606 is controlled by a voltage variable capacitor control signal 527 from D/A converter 526 by way of an inductor 610. The signal generated by D/A converter and the control of voltage variable capacitor 606 will be discussed in detail reference to FIG. 9.

Coupled between VVC circuitry 506 and the RF output circuitry 207 is the detecting circuitry 215 for detecting the power level of the RF output signal 206 prior to filtering by the RF output circuitry 207. The detecting circuitry 215 includes a directional coupler 507 which couples the RF output signal 206 to a detector 508 without causing excessive loss to the RF output signal 206. Directional coupler 507 preferably includes a resistor and a diode for directing the coupled RF output signal 206 to the detector 508. Detector 508 comprises a low pass filter to output the detected power output signal 216 having a voltage that corresponds to the amount of power in the RF output signal 206. The detected power output signal 216 is then coupled to the integrating circuitry 217.

In order to maintain the amount of power in RF output signal 206 at a constant level, processor circuitry 219 also provides the power output control signal 218. Power output control signal 218 represents a voltage corresponding to the amount of power that should be contained in the RF output signal 206. Power output control signal 218 is preferably produced by a microprocessor 617, such as a 68HC11 microcontroller available from Motorola, Inc., contained within the processor circuitry 219. Microprocessor 617 determines which one of the plurality of predetermined power output levels the transmitter 123 should be operating based upon a power control instruction sent by a fixed transceiver.

Microprocessor 617 also accesses phasing value, stored in an associated memory 528 in order to set the voltage of the power output control signal 218. During the manufacture of the radiotelephone 100 phasing values are programmed into the memory 528. The stored phasing values typically consist of the plurality of predetermined power output levels. Each of the plurality of predetermined power output levels represent an actual power value that defines the amount of power in RF output signal 206. Microprocessor 617 selects power output control signal 218 from the phasing values stored in the memory 528 by comparing the determined power output level with the power output level dictated by the power control instruction.

Integrating circuitry 217 controls the amount of power in the RF output signal 206 by varying amplifier control signal 211 in response to the comparison of detected power output signal 216 and power output control signal 218. The detected power output signal 216 and the power output control signal 218 are preferably coupled to the respective negative (−) and positive (+) inputs of integrator 520. Integrating circuitry 217 further includes power control circuit 521 coupled between the output of the integrator 520 and power amplifier driver 504. Power control circuit 521 acts as a buffer and could comprise for example, an npn transistor 627 and a p-channel enhancement mode MOSFET (Metal Oxide Semiconductor Field Effect Transistor) 629. A resistor 631 couples the base of the npn transistor 627 to the output of the integrator 623. The collector of npn transistor 627 is coupled to the gate of the MOSFET 629. A resistor 633 couples the gate of MOSFET 629 to $V_{B+}$. The drain of MOSFET 629 is coupled by way of a resistor 635 to the emitter of npn transistor 627 which is coupled to ground by way of a resistor 637.

In operation, if the voltage of the detected power output signal 216 is less than the voltage of the power output control signal 218, the voltage at the output of the integrator 520 is increased. As the voltage increases, the current flowing into the base of npn transistor 627 increases causing the current flowing into the collector of npn transistor 627 to increase. When the current flowing into the collector of npn transistor 627 increases, a voltage across resistor 633 coupling both the power source 209 and the source of MOSFET 629 to the gate of MOSFET 329 increases causing MOSFET 629 to turn on. Upon turn on, a portion of the drain current of MOSFET 629 comprising amplifier control signal 211 flows to the power amplifier driver 504 and varies the magnitude of amplification of amplifying circuitry 203. Another portion of the drain current flows through resistor 635 and resistor 637 generating a voltage on the emitter of transistor 627 tending to turn off transistor 627.

Conversely, if the voltage of the detected power output signal 216 is greater than the voltage of the power output control signal 218, the voltage at the output of the integrator 520 is decreased. A decrease in the voltage at the output of the integrator 520 causes the current flowing into the base of the npn transistor 627 to decrease. This, in turn, causes the current flowing into the collector of the npn transistor 627 to decrease further causing the voltage drop across the resistor 633 causes the MOSFET 629 to turn off, reducing the amplifier control signal 211. A reduction in the amplifier control signal causes the power amplifier driver 504 to reduce the magnitude of the amplification of the amplifying circuitry 203.

In addition to maintaining constant power at the output, processor circuitry 219 also adjusts the control voltage on VVC 606 to vary the load at the output of power amplifier 304 to force the amplifying circuitry 203 to operate as close to saturation as possible without inhibiting the output power control loop from maintaining the necessary amount of power in the RF output signal 206. Because output power decreases as the amplifying circuitry 203 functions closer to saturation, the voltage at VVC 606 is dynamically increased or decreased to maintain the required amount of power in the RF output signal 206 and maximize the efficiency of the amplifying circuitry 203.

In particular, microprocessor 617 of the processor circuitry 219 functions to dynamically increase or decrease the voltage at VVC 606 in response to the voltage levels of power source 209 and amplifier control signal 211. The voltage levels of both the power source 209 and the amplifier control signal 211 are coupled to the microprocessor 617 via respective analog-to-digital (A/D) converter 524 contained in the processor circuitry 219. A/D converter 524 translates the continuous, time-varying analog voltages of the power source 209 and the amplifier control signal. 211 into discrete digital values. Microprocessor 617 compares the voltage levels of power source 209 and amplifier control signal 211 with respect to a predetermined value stored in memory 528. If the voltage level of power source 209 is within the predetermined value of the voltage level of amplifier control signal 211, microprocessor 617 adjusts the voltage at VVC 606 to prevent amplifying circuitry 203 from saturating. Alternatively, if the voltage level of power source 209 is not within the predetermined value of the voltage level of amplifier control signal 211, microprocessor 617 adjusts the voltage at VVC 606 in the opposite direction to force amplifying circuitry 203 closer to saturation and thus improve the efficiency of amplifying circuitry 203.

Figure 9:
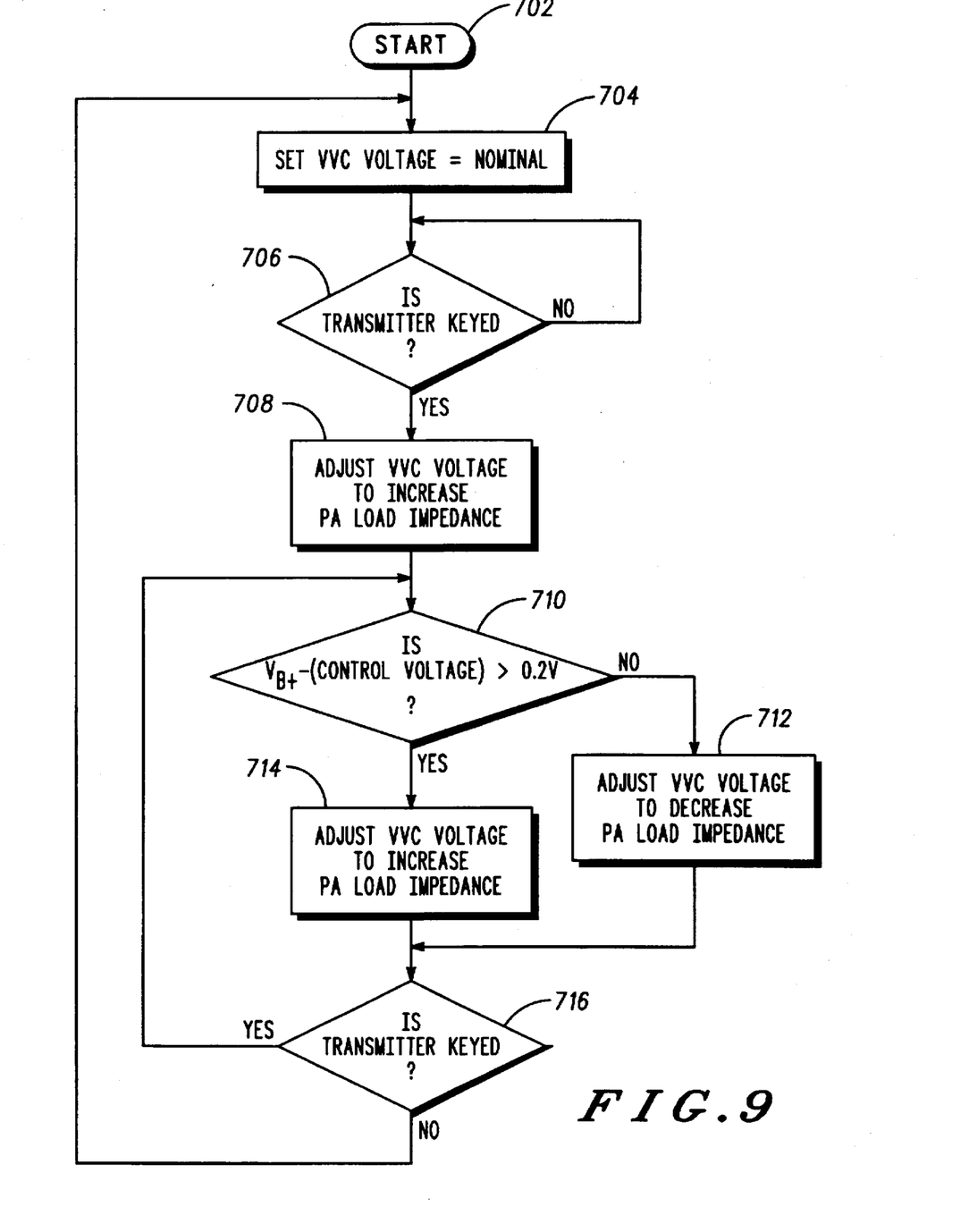
FIG. 9 is a flow chart showing the operation of the transmitter circuit of FIG. 7.

Turning now to FIG. 9, a flow chart shows the preferred method for efficiently amplifying a signal according to the present invention. Code for controlling elements of radiotelephone 100 and implementing the method of the present invention may be stored in, and executed by, the processor circuitry 219. After initiating the algorithm at step 702, processor circuitry 219 sets the VVC voltage to a nominal voltage such as 0 volts or 2 volts at step 704. At step 706, processor circuitry 219 determines if transmitter 123 is keyed or, in effect, prepared to transmit. Step 706 is repeated until the transmitter 123 is keyed.

Once the transmitter 123 is keyed at step 706, processor circuitry 219 adjusts VVC voltage to increase the power amplifier load impedance at a step 708. Processor circuitry 219 then determines whether or not to increase or decrease the VVC voltage of amplifying circuitry 203 to increase efficiency. At step 710, processor circuitry 219 determines whether or not the difference between the voltage of power source 209, $V_{B+}$, and amplifier control signal 211 ("control voltage") is within a predetermined range. In the preferred embodiment, the predetermined range is 0.2 V, which corresponds to the minimum voltage drop across the FET transistor 629 included in the integrating circuitry 217 (see FIG. 3). If the difference between $V_{B+}$ and amplifier control signal 211 is less than 0.2 V, the VVC voltage adjusted to decrease the power amplifier load impedance at a step 712.

If the difference between VB, and amplifier control signal 211 is greater than 0.2 V, the processor circuitry 219 varies the VVC voltage to increase the power amplifier load impedance at a step 714 forcing the amplifying circuitry 203 to run closer to saturation and, thus, increasing the efficiency of the amplifying circuitry 203.

After increasing or decreasing the VVC voltage, the processor circuitry 219 once again determines whether or not transmitter 123 is keyed at step 716. If the transmitter 123 is determined to be keyed, the processor circuitry 219 returns to step 710. If the transmitter 123 is not keyed, the processor circuitry 219 returns to step 704.

Figure 10:
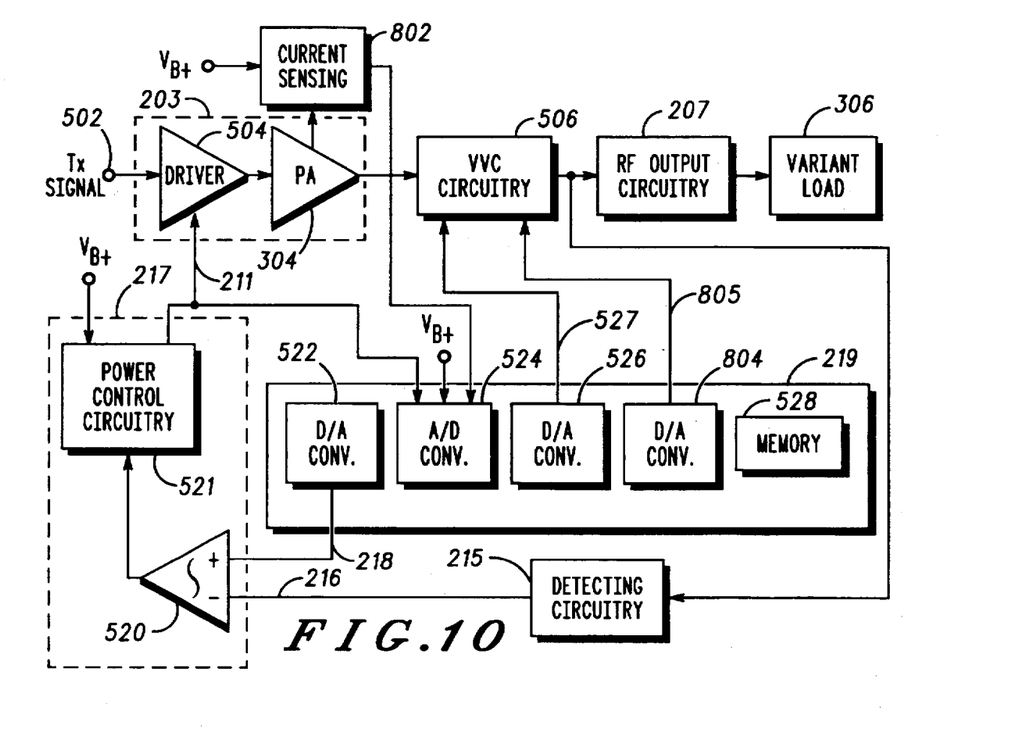
FIG. 10 is a block diagram of an alternate embodiment of a transmitter circuit according to the present invention.

Turning now to FIG. 10, a block diagram shows an alternate embodiment of a transmitter according to the present invention. VVC circuitry 506 of FIG. 10 preferably includes two voltage variable capacitors to more accurately control a load at the output of the power amplifier. One of the voltage variable capacitors is adjusted based upon a comparison of the amplifier control signal 211 and power source. A second voltage variable capacitor of VVC circuitry 506 is adjusted based upon the current in power amplifier 304. As shown in FIG. 10, current sensing circuit 802 monitors the current $I_{SENSE}$ drawn at power amplifier 304 and provides an output signal to A/D converter 524. Processor circuitry 219 generates a voltage variable capacitor control signal 805 from D/A converter 804 to control the second voltage variable capacitor of VVC circuitry 506. By separately controlling the two voltage variable capacitors of VVC circuitry 506, the embodiment of FIG. 10 maximizes efficiency of the power amplifier to reduce output current and lower the drain on a battery for the device.

Figure 11:
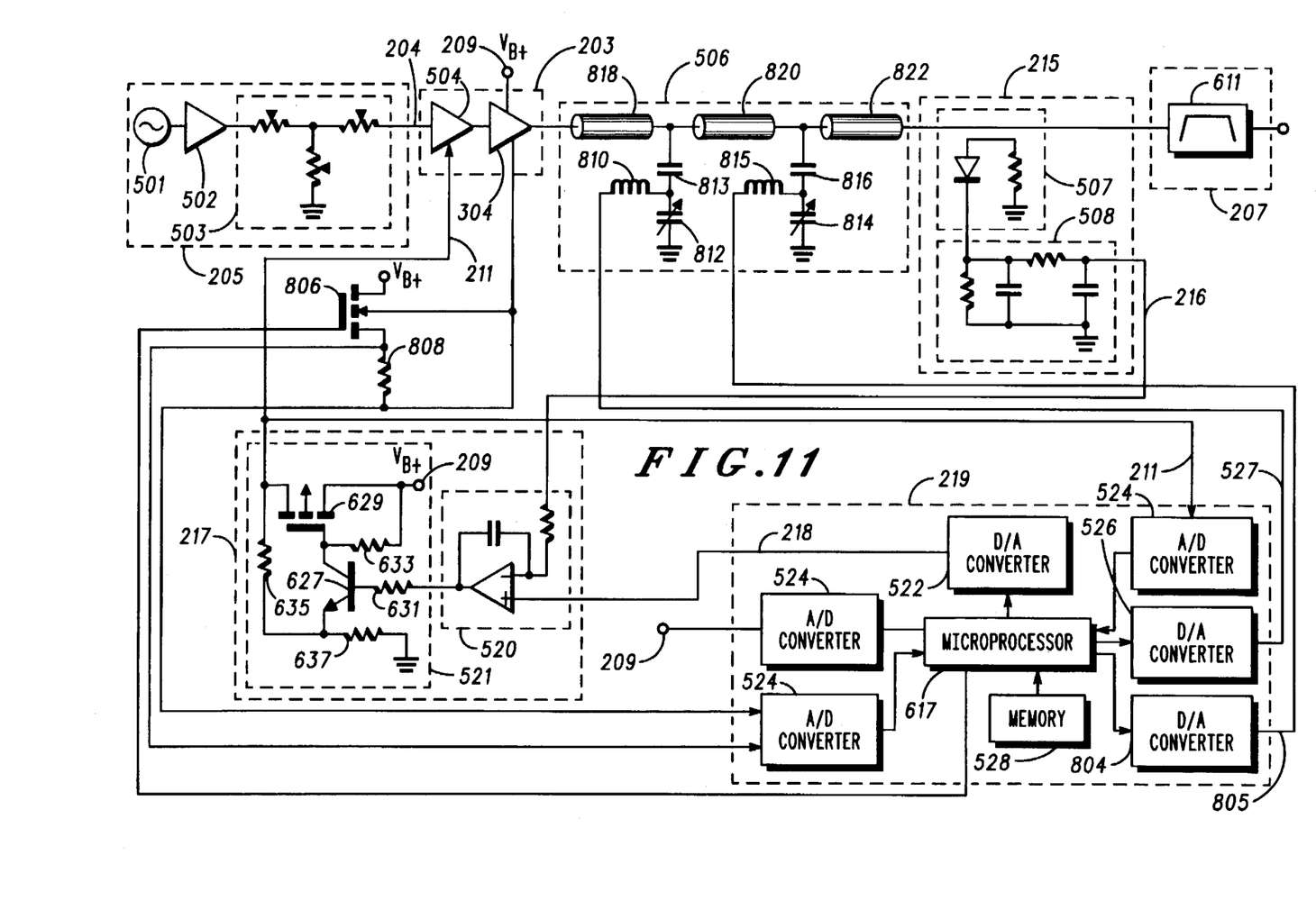
FIG. 11 is a schematic diagram of the transmitter circuit of the alternate embodiment of FIG. 10.

Turning now to FIG. 11, a schematic diagram of the transmitter circuit of FIG. 10 shows the preferred arrangement for current sensing circuit 802 and VVC circuitry 506. Current sensing circuit 806 preferably comprises a MOSFET 807 having a source coupled to power source 209 and a gate which is controlled by microprocessor 617. A resistor 808 is coupled between the drain of MOSFET 802 and power amplifier 304. The terminals of sense resistor 808 are coupled to A/D converter 524 of processor circuitry 219. Microprocessor 617 then generates a control signal 805 from D/A converter 804. Control signal 527, which controls a first voltage variable capacitor 810 as set forth in the embodiment of FIG. 9, and control signal 805 are cooperatively controlled to maximize the efficiency of power amplifier 304.

VVC circuitry 506 preferably includes an inductor 810 to receive VVC control signal 527 which controls voltage variable capacitor 812 which is coupled to the output of the power amplifier by way of a capacitor 813. VVC control signal 805 is coupled to a second voltage variable capacitor 814 by way of inductor 815. Voltage variable capacitor 814 is also coupled to the output of the power amplifier by way of a capacitor 816. VVC circuitry 506 preferably includes transmission lines 818, 820, and 822 to match the impedance at the output of the power amplifier.

Figure 12:
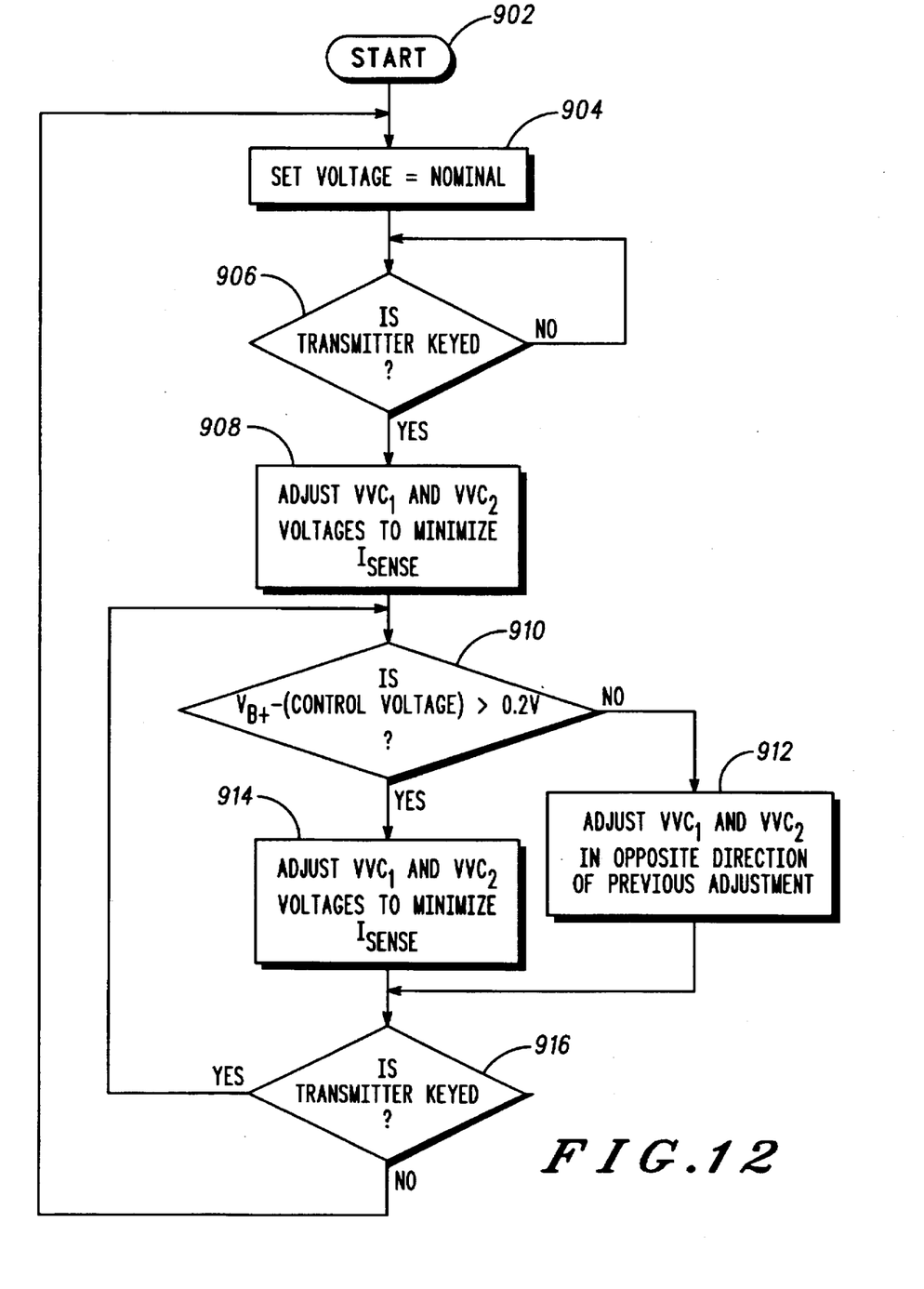
FIG. 12 is a flow chart showing the operation of the transmitter circuit of the alternate embodiment of FIG. 10.

Turning now to FIG. 12, a flow chart shows the preferred method for efficiently amplifying a signal according to the present invention. Code for controlling elements of radiotelephone 100 and implementing the method of FIG. 12 may also be stored in, and executed by, the processor circuitry 219. After initiating the algorithm at step 902, processor circuitry 219 sets the VVC voltage to a nominal voltage at step 904. At step 906, processor circuitry 219 determines if transmitter 123 is keyed or, in effect, prepared to transmit. Step 906 is repeated until the transmitter 123 is keyed.

Once the transmitter 123 is keyed at step 906, processor circuitry 219 adjusts the $VVC_1$ voltage and $VVC_2$ voltage to minimize $I_{SENSE}$ at a step 908. $VVC_1$ and $VVC_2$ can be adjusted in the same direction, or could be independently adjusted to minimize $I_{SENSE}$. Processor circuitry 219 then determines whether or not to adjust the VVC Voltages of amplifying circuitry 203 to increase efficiency. At step 910, processor circuitry 219 determines whether or not the difference between the voltage of power source 209, $V_{B+}$, and amplifier control signal 211 ("control voltage") is within a predetermined range. In the preferred embodiment, the predetermined range is 0.2 V, which corresponds to the minimum voltage drop across the FET transistor 629 included in the integrating circuitry 217. If the difference between $V_{B+}$ and control voltage is less than 0.2 V, the voltages $VVC_1$ and $VVC_2$ are adjusted at a step 912 opposite to the adjustment in step 908 to prevent the power amplifier from operating too far in saturation. Alternatively, $VVC_1$ and $VVC_2$ could be independently adjusted while monitoring $I_{SENSE}$ to maximize the efficiency of the power amplifier.

If the difference between $V_{B+}$ and control voltage is greater than 0.2 V, the processor circuitry 219 further varies the VVC voltages to reduce $I_{SENSE}$ at a step 714 forcing the amplifying circuitry 203 to run closer to saturation and, thus, increasing the efficiency of the amplifying circuitry 203. After increasing or decreasing the VVC voltage, the processor circuitry 219 once again determines whether or not transmitter 123 is keyed at step 916. If the transmitter 123 is determined to be keyed, the processor circuitry 219 returns to step 910. If the transmitter 123 is not keyed, the processor circuitry 219 returns to step 904.

Figure 13:
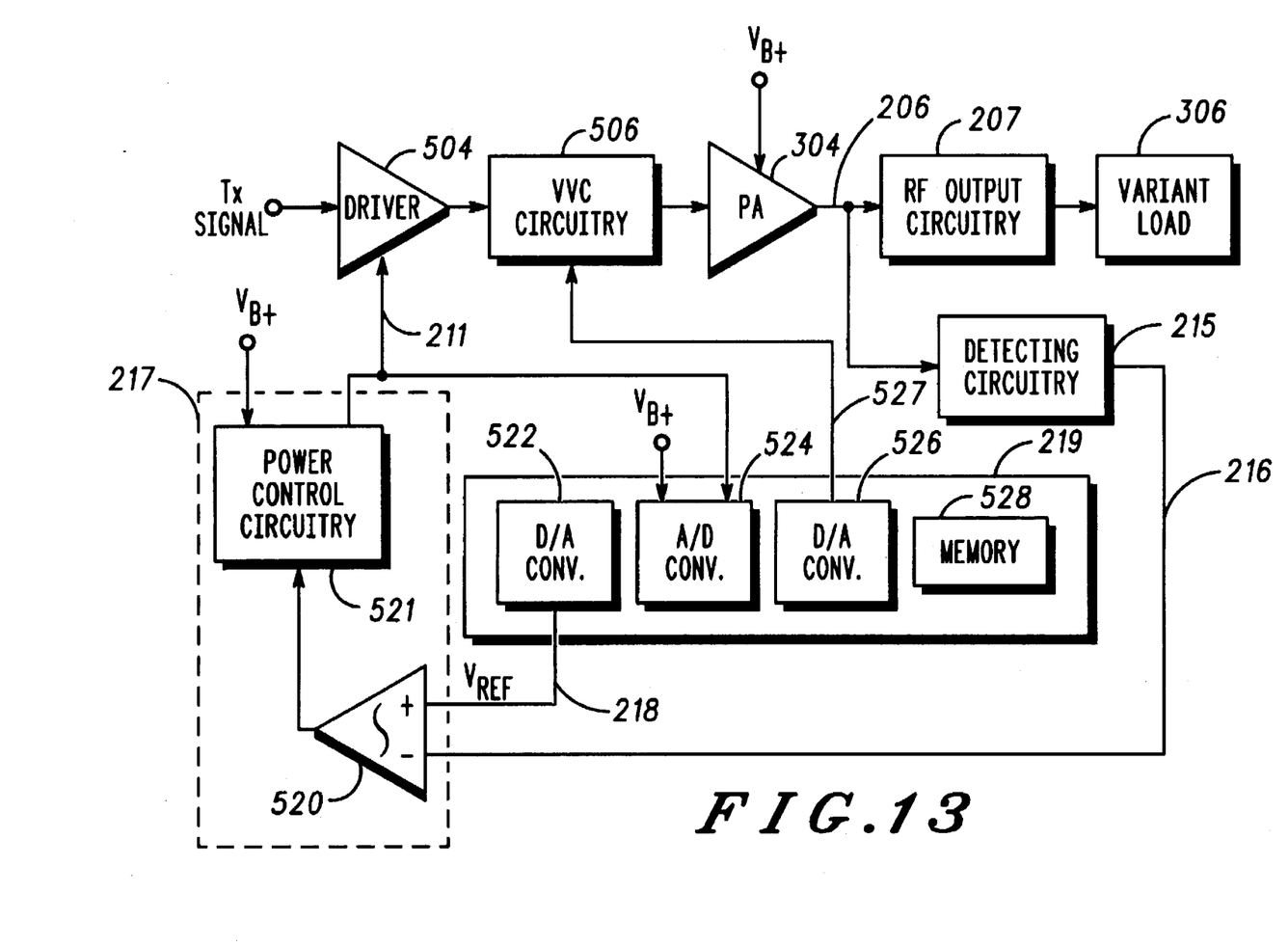
FIG. 13 is a block diagram of an alternate embodiment of a transmitter circuit for a wireless communication device according to the present invention.
Figure 14:
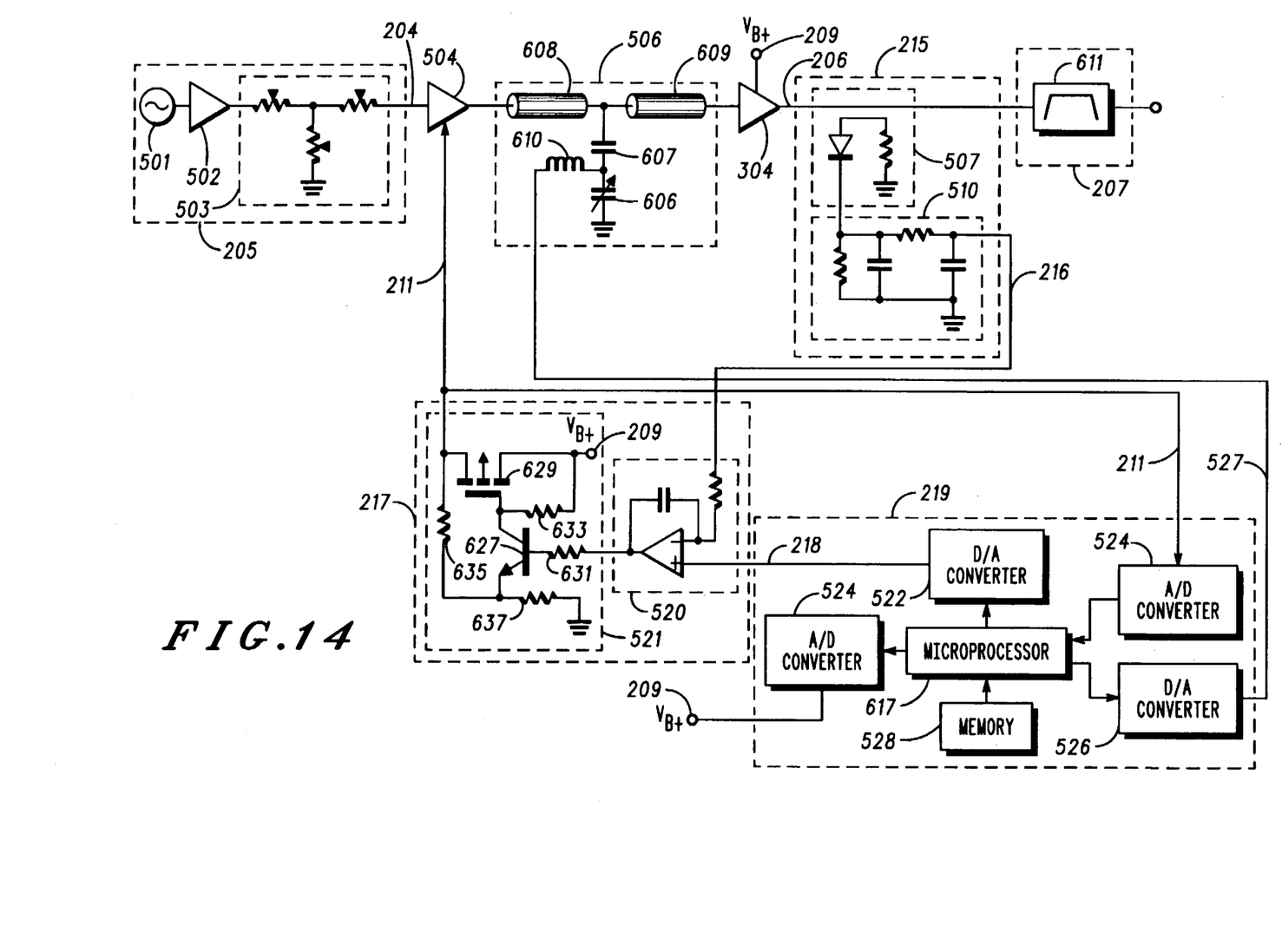
FIG. 14 is a schematic diagram of the transmitter circuit of FIG. 13.

Turning now to FIG. 13, a block diagram shows an alternate embodiment of a transmitter circuit for a wireless communication device according to the present invention. The embodiment of FIG. 13 incorporates a VVC circuit at the input of the power amplifier to compensate for variations in input impedance. The VVC is positioned before the power amplifier to improve other power amplifier parameters such as IM, gain, output power and noise level. In particular, VVC circuitry 506 is positioned between driver 504 and power amplifier 304. VVC circuitry 506 receives VVC control signal 527. Processor circuitry 219 generates VVC control signal 527 based upon the output signal of the power amplifier received at detecting circuitry 215. The remaining portion of the circuitry operates in the same manner as set forth in FIG. 7. FIG. 14 shows a schematic diagram of the circuit of FIG. 13. The operation of the circuit of FIG. 14 is described in detail in reference to FIG. 8. However, VVC control signal 527 is generated to improve power amplifier parameters such as IM, gain, output power, noise level or different battery operating regions based upon an evaluation of the output signal by processor circuitry 219. While the VVC circuitry is preferably positioned between the driver circuit and the power amplifier, the VVC circuit could be positioned at any position before the power amplifier.

In summary, the present invention modifies the load impedance at the output of the power amplifier to maximize the efficiency of the power amplifier. In a first embodiment, an integrator generates a control signal based upon the comparison of a detected output signal and a reference signal. The control signal is preferably coupled to a variable attenuator to provide control for a conventional power control loop. The control signal is also coupled to a voltage variable capacitor circuit to control the output impedance of the power amplifier and maximize the efficiency of the power amplifier. In an alternate embodiment, an integrator generates a power control signal based upon the comparison of a detected output signal and a reference signal. The power control signal is preferably coupled to a driver stage of a power amplifying to provide control for a conventional power control loop. A voltage variable capacitor control signal based upon a comparison of the power control signal and the battery voltage is also coupled to a voltage variable capacitor circuit to control the output impedance of the power amplifier and maximize the efficiency of the power amplifier. Also, a second voltage variable capacitor can be coupled in parallel to the first voltage variable capacitor. The second voltage variable capacitor can be controlled by a signal based upon the current in the power amplifier. Finally, an alternate embodiment incorporates a VVC circuit at the input of the power amplifier to compensate for variations in input impedance to improve other power amplifier parameters such as IM, gain, output power and noise level.

Although the invention has been described and illustrated in the above description and drawings, it is understood that this description is by way of example only and that numerous changes and modifications can be made by those skilled in the art without departing from the true spirit and scope of the invention. For example, voltage variable capacitors could be placed at both the input and the output of the power amplifier in a signal device to control both source and load impedance variations. Although the present invention finds particular application in portable cellular radiotelephones, the invention could be applied to any wireless communication device, including pagers, electronic organizers, or computers. Applicants' invention should be limited only by the following claims.

We claim:

1. An apparatus for amplifying a signal comprising:
   a power amplifier having an input and an output, said power amplifier being adapted to receive an input signal and generate an output signal which is an amplified version of said input signal;
   a first voltage variable capacitor coupled to said output of said power amplifier;
   a power detecting circuit coupled to said output for detecting the output power of said output signal; and
   a control circuit coupled to receive a detected power output signal and coupled to said first voltage variable capacitor for controlling the capacitance of said first voltage variable capacitor based upon said detected power output signal.

2. The apparatus for amplifying a signal of claim 1 wherein said control circuit couples a power control signal based upon said detected power output signal to said power amplifier.

3. The apparatus for amplifying a signal of claim 2 wherein said control circuit generates a first voltage variable capacitor control signal to said first voltage variable capacitor.

4. The apparatus for amplifying a signal of claim 3 wherein said first voltage variable capacitor control signal is based upon said power control signal and a battery voltage signal.

5. The apparatus for amplifying a signal of claim 2 further comprising a current sensing circuit coupled to said power amplifier to monitor the current in said power amplifier.

6. The apparatus for amplifying a signal of claim 5 wherein said control circuit is coupled to said current sensing circuit to monitor the current in said power amplifier.

7. The apparatus for amplifying a signal of claim 6 further comprising a second voltage variable capacitor coupled in parallel to said first voltage variable capacitor.

8. The apparatus for amplifying a signal of claim 7 said control circuit generates a second voltage variable control signal to control said second voltage variable capacitor.

9. An apparatus for amplifying a signal comprising:
   a variable attenuator adapted to receive a radio frequency signal;
   a power amplifier coupled to said variable attenuator and having an input and an output, said power amplifier being adapted to receive said radio frequency signal from said variable attenuator and generate an output signal which is an amplified version of said radio frequency signal;
   a voltage variable capacitor circuit coupled to said output of said power amplifier;
   a power detecting circuit coupled to said output to receive said output signal and generate an output power signal; and
   an integrator coupled to receive an output power signal from said power detecting circuit and coupled to provide a control signal to said voltage variable capacitor circuit for controlling the capacitance of said voltage variable capacitor circuit.

10. The apparatus for amplifying a signal of claim 9 wherein said control signal from said integrator is further coupled to said variable attenuator to control the amount of attenuation of said radio frequency signal.

11. An apparatus for amplifying a signal comprising:
   a power amplifier having an input and an output, said power amplifier being adapted to receive an input signal and generate an output signal which is an amplified version of said input signal;
   a first voltage variable capacitor coupled to said output of said power amplifier;
   a power detecting circuit coupled to said output for detecting the output power of said output signal and generating a detected power output signal; and
   a control circuit coupled to receive said detected power output signal from said power detecting circuit and coupled to provide a power control signal to said power amplifier and a voltage variable capacitor control signal to said first voltage variable capacitor for controlling the capacitance of said first voltage variable capacitor.

12. The apparatus for amplifying a signal of claim 11 wherein said first voltage variable capacitor control signal is based upon said power control signal and a battery voltage signal.

13. The apparatus for amplifying a signal of claim 11 further comprising a current sensing circuit coupled to said power amplifier to monitor the current in said power amplifier.

14. The apparatus for amplifying a signal of claim 13 wherein said control circuit is coupled to said current sensing circuit to monitor the current in said power amplifier.

15. The apparatus for amplifying a signal of claim 14 further comprising a second voltage variable capacitor coupled in parallel to said first voltage variable capacitor.

16. The apparatus for amplifying a signal of claim 15 said control circuit generates a second voltage variable control signal to control said second voltage variable capacitor.

17. An apparatus for amplifying a signal comprising:
a power amplifier circuit having an input and an output, said power amplifier circuit being adapted to receive an input signal and generate an output signal which is an amplified version of said input signal;
a voltage variable capacitor circuit comprising a first voltage variable capacitor and a second voltage variable capacitor coupled in parallel to said output of said power amplifier circuit;
a power detecting circuit coupled to receive said output signal and generate a detected power signal;
a control circuit coupled to said first and second voltage variable capacitors for controlling the capacitance of said first and second voltage variable capacitors;
an integrating circuit coupled to said power detecting circuit to receive said detected power signal and to said control circuit to receive a reference voltage, said integrating circuit generating a power control signal to said power amplifier circuit;
current sensing circuit coupled to said power amplifier to monitor the current in said power amplifier circuit and said control circuit; and
wherein said control circuit provides a first voltage variable capacitor signal based upon said power control signal and a battery voltage signal to control said first voltage variable capacitor and provides a second voltage variable capacitor signal based upon said current in said power amplifier circuit to control said second voltage variable capacitor.

18. A method of amplifying a signal comprising:
coupling a first voltage variable capacitor to an output of a power amplifier;
generating an output signal at said output which is an amplified version of an input signal received at an input of said power amplifier;
detecting the output power of said output signal and coupling a detected power output signal to a control circuit; and
controlling the capacitance of said first voltage variable capacitor based upon said output signal.

19. The method of amplifying a signal of claim 18 further comprising a step of coupling a power control signal based upon said detected power output signal to said power amplifier.

20. The method of amplifying a signal of claim 19 wherein said step of controlling the capacitance further comprises generating a first voltage variable capacitor control signal based upon said power control signal and a battery voltage signal.

21. The method of amplifying a signal of claim 20 further comprising a step of sensing the current in said power amplifier.

22. The method of amplifying a signal of claim 21 further comprising a step of coupling a second voltage variable capacitor in parallel to said first voltage variable capacitor.

23. The method of amplifying a signal of claim 22 further comprising a step of generating a second voltage variable capacitor control signal to control said second voltage variable capacitor.

24. The method of amplifying a signal of claim 23 wherein said step of generating a second voltage variable capacitor control signal comprises generating a second voltage variable capacitor control signal based upon said current in said power amplifier.

25. A method of amplifying a signal comprising:
receiving a radio frequency signal at a variable attenuator;
coupling said radio frequency signal to a power amplifier which is adapted to generate an output signal which is an amplified version of said radio frequency signal;
coupling a voltage variable capacitor circuit to an output of said power amplifier;
detecting the output power of said signal generated at said output; and
providing a control signal based upon said detected output power to said voltage variable capacitor for controlling the capacitance of said voltage variable capacitor.

26. The method of amplifying a signal of claim 25 further comprising a step of coupling a second voltage variable capacitor in parallel to said first voltage variable capacitor and generating a second voltage variable capacitor control signal based upon the current in said power amplifier.

27. A method of amplifying a signal comprising:
receiving a radio frequency signal at an input of a power amplifier;
coupling a first voltage variable capacitor to an output of said power amplifier;
detecting the output power of an output signal to generate a detected power output signal; and
providing a power control signal to said power amplifier and a voltage variable capacitor control signal to said first voltage variable capacitor for controlling the capacitance of said first voltage variable capacitor based upon said output power signal.

28. A method of amplifying a signal comprising:
receiving an input signal at an input of a power amplifier circuit;
coupling a voltage variable capacitor circuit comprising a first voltage variable capacitor and a second voltage variable capacitor coupled in parallel to an output of said power amplifier circuit;
detecting the power of an output signal to generate a detected power signal;
coupling said detected power signal and a reference voltage to an integrating circuit, said integrating circuit generating a power control signal to said power amplifier circuit;
controlling the capacitance of said first voltage variable capacitor based upon said detected power signal;
coupling a current sensing circuit to said power amplifier circuit to detect the current in said power amplifier circuit; and
controlling the capacitance of said second voltage variable capacitor based upon the detected current in said power amplifier circuit.

* * * * *